United States Patent
Sairanen

Patent Number: 6,160,693
Date of Patent: Dec. 12, 2000

[54] SHORT CIRCUIT PROTECTION FOR A SEMICONDUCTOR SWITCH

[75] Inventor: Martti Sairanen, Klaukkala, Finland

[73] Assignee: Oy Lexel Finland AB, Espoo, Finland

[21] Appl. No.: 09/242,030

[22] PCT Filed: Jun. 9, 1998

[86] PCT No.: PCT/FI98/00495

§ 371 Date: Mar. 31, 1999

§ 102(e) Date: Mar. 31, 1999

[87] PCT Pub. No.: WO98/59421

PCT Pub. Date: Dec. 30, 1998

[30] Foreign Application Priority Data

Jun. 10, 1997 [FI] Finland ..................... 972455

[51] Int. Cl.[7] .................... H02H 3/18
[52] U.S. Cl. ............... 361/91.5; 361/78; 361/86
[58] Field of Search .................. 361/67, 78, 79, 361/86, 88, 91.5, 100, 101, 93.1; 324/512, 522, 525

[56] References Cited

U.S. PATENT DOCUMENTS

| | | | |
|---|---|---|---|
| 4,595,966 | 6/1986 | Huber et al. ............... | 361/93 |
| 4,626,954 | 12/1986 | Damiano et al. . | |
| 4,893,211 | 1/1990 | Bynum et al. . | |
| 4,914,542 | 4/1990 | Wagoner . | |
| 5,257,155 | 10/1993 | Robb et al. . | |
| 5,485,341 | 1/1996 | Okado et al. . | |
| 5,724,218 | 3/1998 | Tihanyi ................... | 361/79 |
| 5,808,457 | 9/1998 | Rutkowski et al. ............ | 323/282 |
| 5,959,464 | 9/1999 | Qualich .................. | 324/769 |

FOREIGN PATENT DOCUMENTS

| | | |
|---|---|---|
| 41 13 258 | 4/1991 | Germany . |
| 44 32 957 | 9/1994 | Germany . |
| 195 12 911 | 4/1995 | Germany . |
| 9-182275 | 7/1997 | Japan . |
| 94/11936 | 5/1994 | WIPO . |

Primary Examiner—Josie Ballato
Assistant Examiner—Kim Huynh
Attorney, Agent, or Firm—Nixon & Vanderhye P.C.

[57] ABSTRACT

A power control (20, 40) for controlling the electric power fed from voltage source (12) to a load (13) comprises a field effect transistor (21, Q1) for either allowing or disabling the flow of current from voltage source to load as a response to the presence or absence of a control pulse led to the gate of the field effect transistor. Additionally the power control comprises means for measuring the change of the gate potential of the field effect transistor (24, R6, R7) and for either allowing or disabling a control pulse on the basis of the gate potential change measurement. In the power control the control pulse is allowed to switch the field effect transistor (21, Q1) to conducting state when a stop (31) in the voltage increase due to Miller effect is detected at the start of the control pulse, and the control pulse is respectively disabled from switching the field effect transistor to conducting state when no Miller effect stop (33) is detected in the field effect transistor gate potential change at the start of the control pulse.

4 Claims, 3 Drawing Sheets

SHORT CIRCUIT PROTECTION FOR A SEMICONDUCTOR SWITCH

CROSS REFERENCE TO RELATED APPLICATION

This is the U.S. national phase of PCT/FI98/00495 filed Jun. 9, 1998.

BACKGROUND AND SUMMARY OF THE INVENTION

The present invention relates generally to a method of protecting semiconductor switches against destruction or damage caused by a short circuit. The present invention relates especially to a protection in semiconductor switches with a limited switching speed.

Semiconductor switches are commonly used in electrical control applications, because their electrical control can be easily arranged and they contain no moving, wear-prone parts. Thyristors and different kinds of transistors, such as bipolar transistors, FETs (field effect transistors) and IGBT transistors (isolated gate bipolar transistors) are commonly used as switching components.

FIG. 1 is a simplified illustration of a known stepless power control 11 for changing the amount of electrical power fed from an AC voltage source 12 to a resistive load 13. The power control of FIG. 1 is suitable for use as e.g. a dimmer of a mains voltage lighting fixture. The power control 11 comprises a field effect transistor unit, which in this case consists of two FETs 14 and 15 connected in series so that the drain of the first FET is connected to an AC current source 12 via a low-resistance current measurement resistor 16, the drain of the second FET is connected to the load 13 and the sources of FETs 14 and 15 are connected to each other. The gates of the FETs 14 and 15 are connected to control circuit 17 which regularly emits connecting pulses for connecting the FETs to conducting state for the desired time. The mean value of the electric power fed to the load 13 depends on the cycle ratio used in the circuit, i.e. the ratio of the duration of the conducting state of the FETs to the duration of the connecting cycle. The duration of the conducting state of the FET is called switch-on period.

If there is a short circuit in the load 13 or the resistance of the load otherwise considerably decreases from its normal value, the current flowing through a conducting FET is considerably higher than that of normal situation. In a FET, the part of electric power that is transformed into heat can during a short circuit be so large that the overheating during one switch-on period destroys or damages the FET so badly that it won't work correctly. To avoid such damage, there is a differential amplifier 18 in the circuit of FIG. 1 for measuring the voltage loss in the current measurement resistor 16 and for sending an output describing the value thereof to the control circuit 17. If the current being led to the load exceeds that of a normal situation, the control circuit 17 reacts to the signal emitted by the differential amplifier by not sending gate voltage pulses to the FETs, so that there will be no current through the FETs.

A previously known short circuit protection control requires a current measurement resistor rated for a relatively large throughput current. A resistive component connected in series causes a power loss the magnitude of which is proportional to the resistance of the component. The power loss can be minimized by using a current measurement resistor of very small resistance, but this in turn requires stricter tolerances for the measurement circuit measuring the voltage over the current measurement resistor. Strict tolerances increase manufacturing costs.

The purpose of the invention is to disclose a short circuit protection for a power control with small manufacturing costs and reliable and fast operation in case the semiconductor switch is switched to conducting state when there is voltage over the switch.

The aim of the invention is reached by measuring the gate voltage change of the FET acting as the switching element during switching operation and comparing it to the drain-source voltage measured over the FET and by either allowing or disabling the switching of the FET to conducting state on the basis of the result of the measurement.

A characterizing feature of a power control according to the invention comprising a field effect transistor is that it comprises means for measuring the change of the gate potential of the field effect transistor in relation to the voltage over the FET between the source and the drain and means for either allowing or disabling the switching of the FET to conducting state on the basis of the result of the measurement.

The present invention also relates to a method of protecting a power control from the negative effects of an excessive throughput current. A characterizing feature of the method according to the invention is that in the method the change of the FET gate voltage potential is measured in relation to the voltage over the field effect transistor between the source and the drain at the start of the gate control pulse of the field effect transistor and that the switching of the FET to conducting state is either allowed or disabled on the basis of the result of the gate voltage change measurement.

When the voltage pulse is led to the gate of the FET, the gate voltage increases in a normal situation first to a certain intermediate value, after which it is almost constant for a while due to the so-called Miller effect. It is only after this that the gate voltage rises to its peak value. The voltage between the drain and the source decreases intensely simultaneously with the increasing gate voltage and its temporary constant phase, if the electrical current through the FET from its drain to its source stays within normal values. In case of a short circuit the current increases intensely, there is no noticeable decrease in the voltage between the drain and the source and there is no Miller effect. In the short circuit protection according to the invention the gate voltage of the FET is measured and compared with a reference voltage higher than the value where the increase of the gate voltage temporarily stops due to Miller effect. If the gate voltage exceeds the reference voltage when the voltage between the drain and the source is high, there is a short circuit. In this case, gate voltage input to the FET will be cut.

The present invention is especially suitable for use in applications in which it is desirable to switch the FET controlling the alternating voltage throughput to conducting state in other phases than during the zero point of the alternating voltage. The circuit according to the invention can be manufactured using inexpensive low voltage components.

BRIEF DESCRIPTION OF THE DRAWINGS

In the following, the invention is described in more detail with reference to the preferable embodiment shown as an example and with reference to the following pictures, of which

DETAILED DESCRIPTION OF THE DRAWINGS

Figure 1:
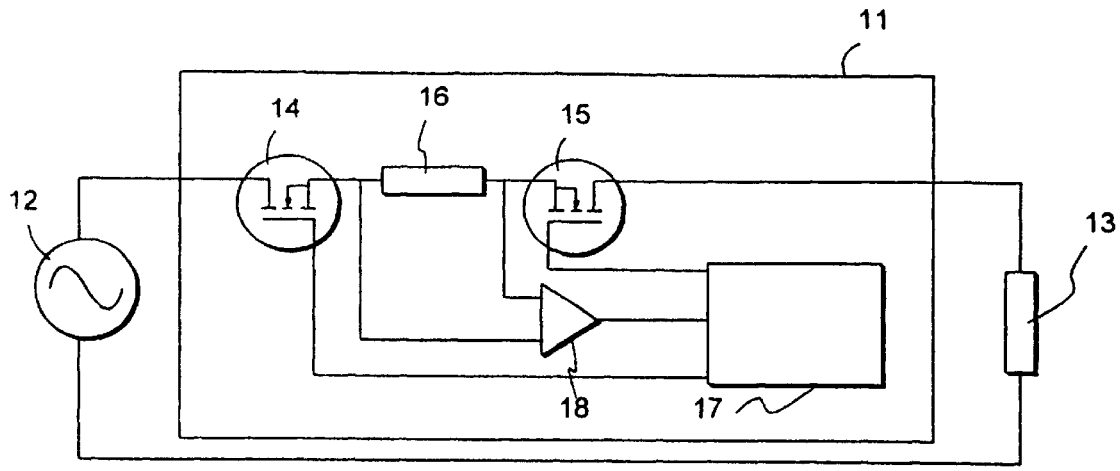
FIG. 1 illustrates a previously known art power control

The previously known application in the above is described with reference to FIG. 1, so in the following description of the invention and its preferable embodiments reference is mainly made to FIGS. 2 to 4. In the figures, corresponding parts are referred to with the same reference numbers.

Figure 2:
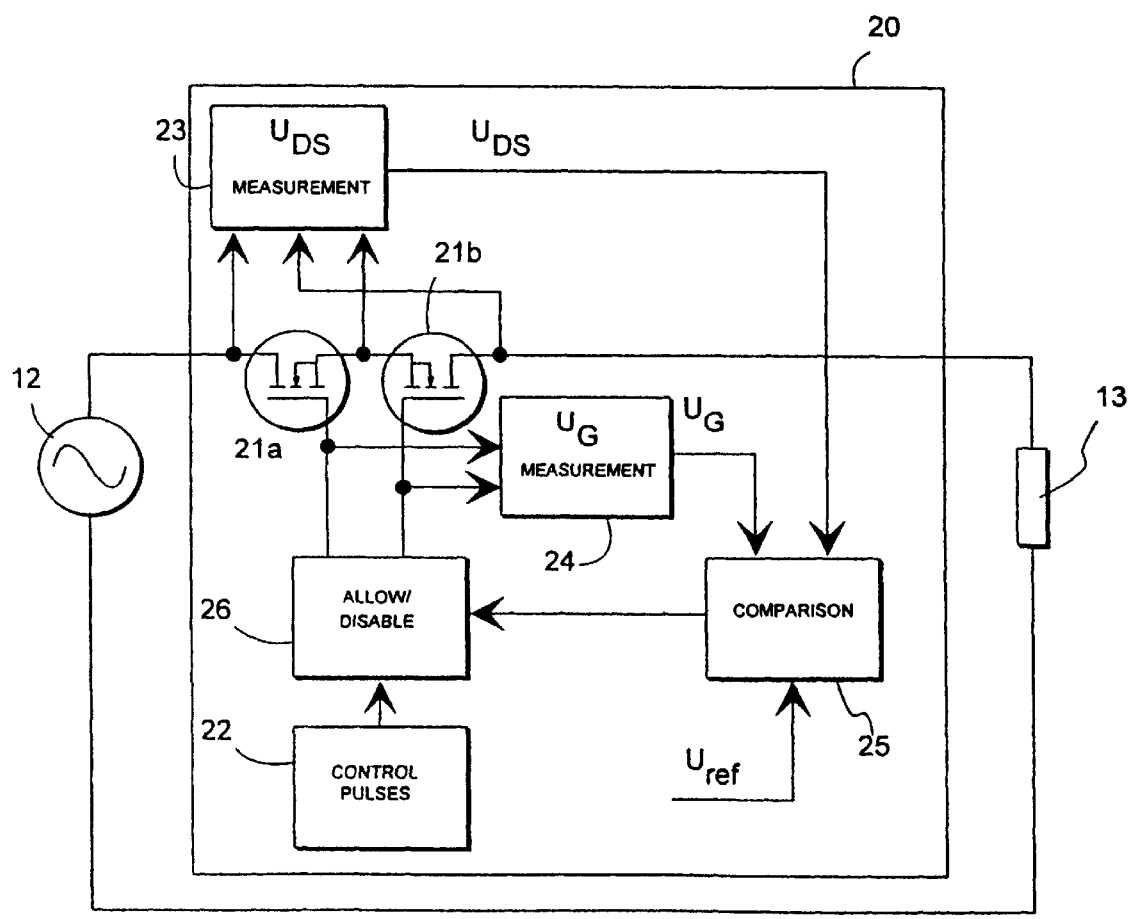
FIG. 2 illustrates the principle of the invention

The power control 20 of FIG. 2 comprises FETs 21a and 21b, a control circuit 22, a voltage measurement circuit 23 for the voltage between the drain and the source, a gate voltage measurement circuit 24, a comparison means 23 and a block 26 for either allowing or disabling gate voltage pulse input to the gate of the FETs 21a and 21b depending on the result of the comparison means 25. The power control controls the amount of electrical power fed from AC voltage source 12 to load 13.

Figure 3:
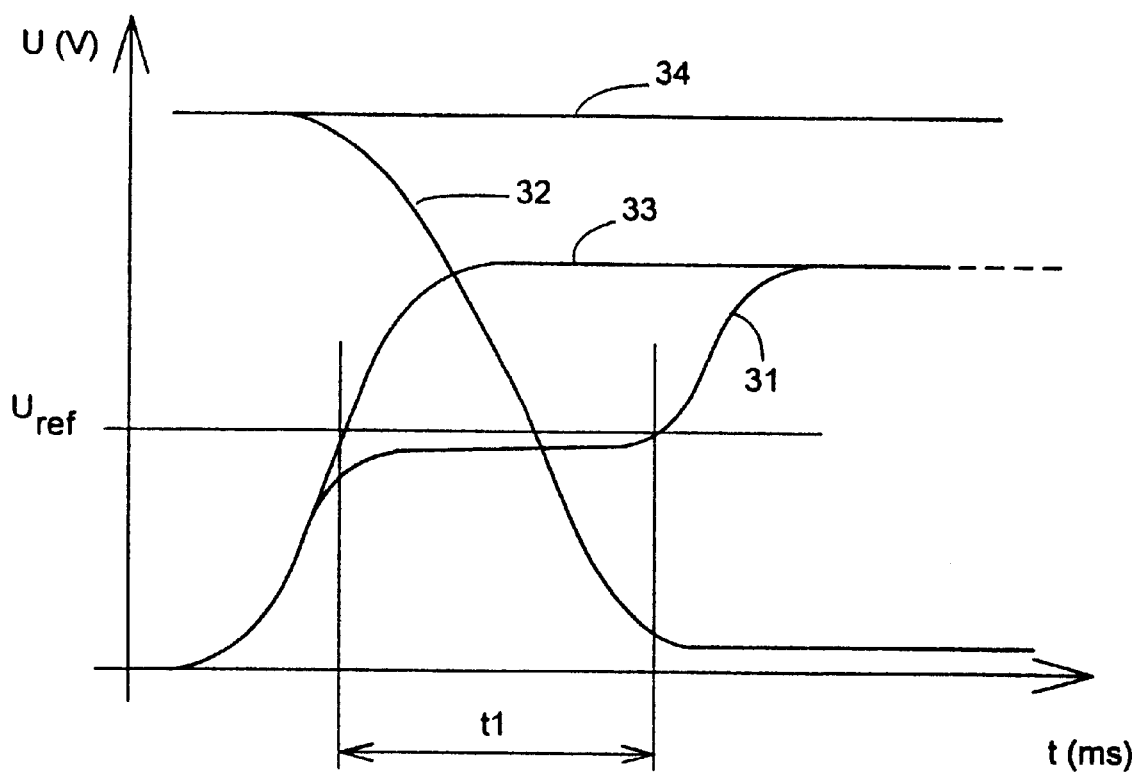
FIG. 3 is a graphic illustration of some voltages as function of time in a circuit illustrated in FIG. 2.

The voltage curves illustrated in FIG. 3 will greatly ease the understanding of the operating principle of a circuit according to FIG. 2. The voltage curves of FIG. 3 are purely qualitative, so the vertical voltage scale of the figure is irrelevant as far as the invention is concerned. The horizontal axis is the time axis, but its scale is irrelevant to the invention as well. The scale can be described by stating the fact that in order to reduce RF interference the aim is not to switch the semiconductor switches of the power control to conducting state as fast as possible, but the aim is to maintain the switching times in the range of some tens of microseconds. The curve 31 illustrates the gate voltage $U_G$ of the switching FET 21a or 21b as a function of time when the FET is switched to conducting state and there is no short circuit in the load 13. The curve 32 illustrates the gate voltage $U_G$ of a FET as a function of time when the FET is switched to conducting state and there is a short circuit in the load 13. The curve 33 illustrates the voltage between the drain and source of the FET, when the FET is switched to conducting state and there is no short circuit in the load 13. The curve 34 illustrates the voltage between the drain and source of the FET, when the FET is switched to conducting state and there is a short circuit in the load 13.

When the control circuit 22 feeds a positive voltage to the gate of the FET 21a or 21b for switching the FET 21a or 21b to conducting state, the gate voltage $U_G$ starts to increase. When curves 31 and 33 are compared to each other, it can be seen that initially the gate voltage $U_G$ increases rapidly, but the increase evens out for the duration of the interval $t_l$ while the voltage $U_{DS}$ between the drain and source decreases rapidly during the interval $t_l$. The behaviour of the voltages is due to the Miller effect, known as such, which in turn is caused by the non-ideal conditions of the FET, especially the internal capacitances of the FET. After the interval $t_l$ the gate voltage $U_G$ starts to increase, until it reaches a peak value, which is indicated by a dotted line. Please note that the Miller effect causes the gate voltage $U_G$ to exceeds the reference voltage $U^{ref}$ only after a time corresponding to the interval $t_l$ later than were the case without the momentary evening out caused by the Miller effect.

If there is a short circuit in the load 13, the voltage $U_{DS}$ between the drain and the source of the FET does not decrease noticeably even though the FET is switched to conducting state, but remains nearly constant as described by the curve 34, because the mains network feeding electrical power to the circuit is a rigid source. During a short circuit the current through both the FET and the load increases rapidly. In this case the Miller effect does not reduce the increase of the gate voltage $U_G$, but it rises to its peak value as described by curve 33. Thus the gate voltage $U_G$ exceeds the reference voltage $U_{ref}$ noticeably sooner than in normal situation with a relatively high resistance of the load 13.

The comparison means 25 compares on the other hand the gate voltage $U_G$ to the reference voltage $U_{ref}$ and on the other hand monitors the value of the voltage $U_{DS}$ between the drain and source of the switching FET. The operation of the comparison means is illustrated in the following table.

| $U_G$ | $U_{DS}$ | Connecting the gate voltage pulse |
|---|---|---|
| <$U_{ref}$ | large | allowed |
| >$U_{ref}$ | large | disabled |
| X | small | allowed |

The X at the lower left corner of the table indicates that in this case the value of the gate voltage $U_G$ is irrelevant. A detailed exemplary embodiment of the invention disclosed later specifies a way of defining the values "large" and "small" of the voltage $U_{DS}$. The values in the right-hand column define whether the comparison means 25 instructs the block 26 either to allow or disable the sending of the gate voltage pulse to the FET. This means that if the gate voltage $U_G$ is significantly higher than the reference voltage without a significant decrease in the voltage $U_{DS}$ between the drain and source, the comparison means interprets this as a short circuit in the load 13, and so activates block 26 to disable the positive voltage produced by block 22 from reaching the gate of the FET 21a or 21b.

Figure 4:
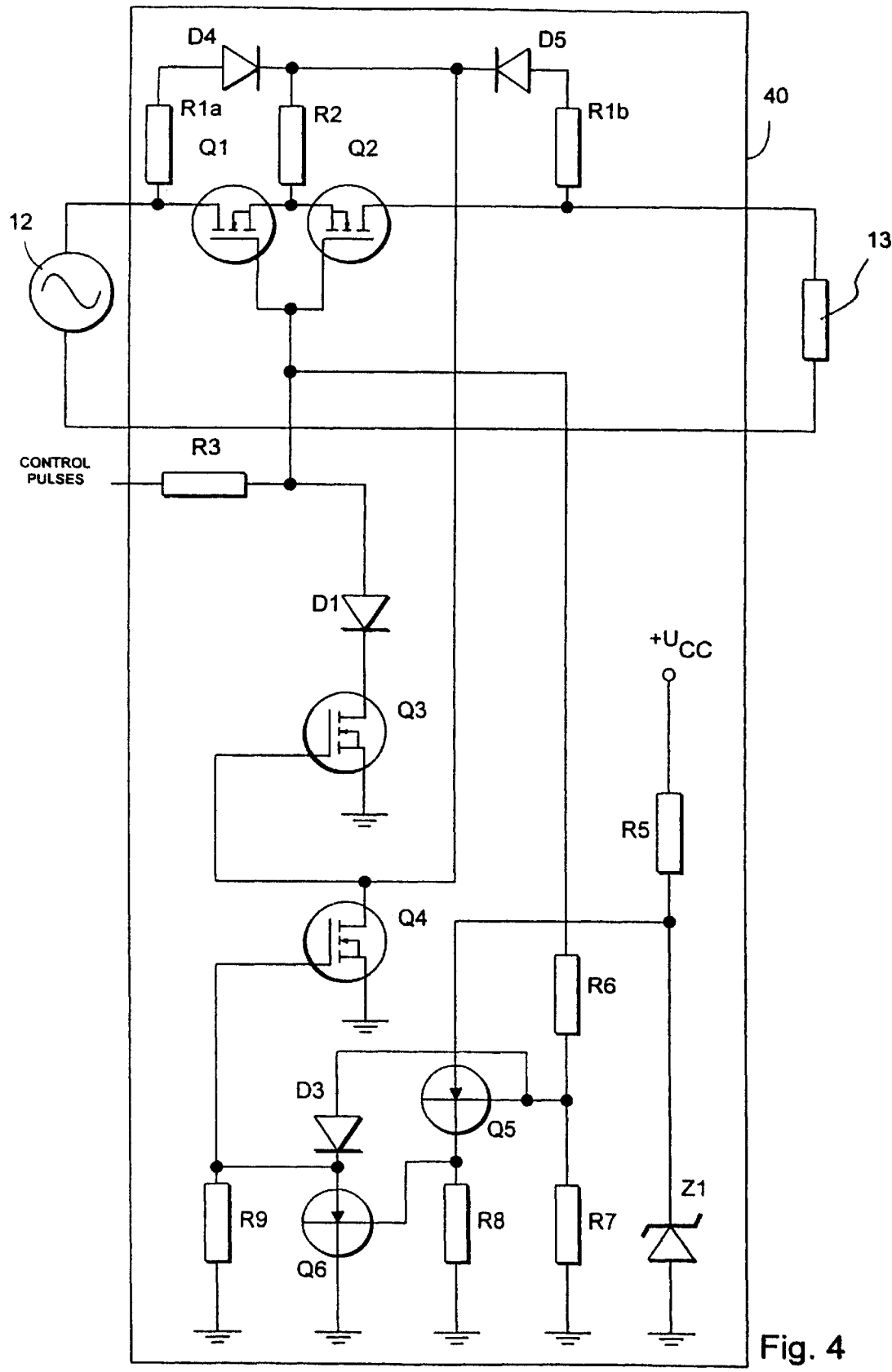
FIG. 4 is an illustration of an exemplary circuit for carrying out the invention.

FIG. 4 illustrates an embodiment of the invention as a circuit diagram. The power control 40 comprises in this case as well two FETs Q1 and Q2 connected in series along the current path from the AC power source 12 to the load 13 in the same way as in the previously known solution illustrated in FIG. 1. The control voltage pulses are fed to the gates of the FETs Q1 and Q2 from the control circuit (not shown for clearness) via resistor R3. The control circuit can be a previously known control circuit. A first voltage dividing circuit comprising two resistors R1a and R2 and a diode D4 with the diode D4 connected between the resistors so that its anode is connected to the resistor R1a and its cathode is connected to the resistor R2 is connected in parallel with the first FET Q1, i.e. between the drain and the source of the FET. The point between the cathode of the diode D4 and the resistor R2 is connected to the gate of the FET Q3 and to the drain of the FET Q4. The resistors R1b and R2 and the diode D5 form correspondingly a second voltage dividing circuit over the FET Q2. The gates of the FETs Q1 and Q2 are connected via a forward diode D1 to the drain of the FET Q3 and the source of the FET Q3 is connected to earth potential.

The resistors R6 and R7 connected in series form a third voltage dividing circuit between the gates of the FETs Q1 and Q2 and earth potential. The point between the resistors R6 and R7 is connected to the base of a bipolar pnp transistor Q5, which is further connected to the emitter of bipolar pnp transistor Q6 via a forward diode. The collector of the transistor Q5 is connected to the base of the transistor Q6 and further to earth potential via shunting resistor R8. The collector of the transistor Q6 is connected to earth potential. The point between the cathode of the diode D3 and the emitter of the transistor Q6 is connected to the gate of the FET Q4 and further to earth potential via shunting resistor R9. The circuit formed by the transistors Q5 and Q6 and the passive components connected thereto is a comparison means for producing a positive voltage signal to the gate of the FET Q4 only when the emitter voltage of the transistor Q5 is higher than the gate voltage of the transistor.

The circuit illustrated in FIG. 4 operates as follows: If there currently is a positive half-cycle in the alternating voltage 12, the first voltage dividing unit formed by the resistors R1a and R2 and the diode D4 forms a certain positive voltage, proportional to the momentary value of the alternating voltage, for trying to switch the FET Q3 to conducting state. But if the voltage between the gate of the FET Q1 and the earth potential is smaller than the reference voltage formed from input voltage +$U_{CC}$ (for example +10 V) by means of the resistor R5 and the zener diode Z1, the transistors Q5 and Q6 are in non-conducting state. In this case the current flowing from the reference voltage to earth potential via the diode D3 and the resistor R9 forms a positive voltage to the gate of the FET Q4 for keeping the FET Q4 in conducting state, whereby the voltage formed by the first voltage dividing circuit R1a, D4 and R2 flows to earth potential via FET Q4 and does not switch the FET Q3 to conducting state.

When a positive control pulse is fed to the gate of the FET Q1 via resistor R3, the gate voltage of the FET Q1, previously referred to as $U_G$, starts to increase. With no short circuit in the load 13 the increase stops for a while due to the Miller effect on a level of which the part produced by the third voltage dividing circuit R6, R7 is smaller than the reference voltage formed from the input voltage +$U_{cc}$ by means of the resistor R5 and the zener diode Z1. In this case the FET Q4 remains in conducting state, the FET Q1 starts to switch to conducting state and the voltage measured by the voltage dividing circuit R1a, D4 and R2 between the drain and source of the FET Q1 starts to decrease. As described by curves 31 and 33 in FIG. 3, the voltage $U_{DS}$ between the drain and source of the FET Q1 will decrease to a low level before the gate voltage $U_G$ of the FET Q1 (and the part thereof produced by the third voltage dividing circuit R6, R7) starts to increase again. When the base voltage of the transistor Q5 increases so as to exceed the reference voltage formed from the input voltage +$U_{cc}$ by means of the resistor R5 and the zener diode Z1, the transistors Q5 and Q6 are switched to conducting state, whereby the gate voltage of the FET Q4 decreases to near zero and the FET Q4 is switched to non-conducting state. Now the FET Q3 could be switched to conducting state, if the voltage produced by the first voltage dividing circuit R1, R2 were large enough, but as this voltage has already had the time to decrease when the FET Q1 is switched to conducting state, this will not happen.

If there is a short circuit in the load 13 when sending a positive control pulse to the gate of the FET Q1 via the resistor R3, the increase of the gate voltage of the FET Q1 is continuous as described by the curve 32 in FIG. 3 and there is no Miller effect stop. The part of the voltage between the drain and source of the FET Q1 produced by the first voltage dividing circuit R1a, D4 and R2 FET Q3 to non-conducting state in this case as well. The conductivity of the FET Q4 at first stops this from happening, but as soon as the part produced by the second voltage dividing circuit R6, R7 exceeds the reference voltage formed from the input voltage +$U_{cc}$ by means of the resistor R5 and the zener diode Z1, the FET Q4 is switched to non-conducting state. The curve 34 of FIG. 3 describes the small change in the voltage between the drain and source of the FET Q1 (and so the part produced thereof by the first voltage dividing circuit R1a, D4, R2 is almost constant as well), which causes the FET Q3 to switch into conducting state and the control pulse fed to the gate of the FET Q1 via resistor R3 flows to earth potential through diode D2 and FET Q3. The FET Q1 is immediately switched to non-conducting state and there will be no time for a dangerously high current to go through it.

The above description can easily be applied to the negative half-cycle of the AC power source 12, during which the FET Q2 will be switching and the short circuit protection is carried by measuring the gate voltage of the FET Q2 in relation to the voltage between the drain and the source.

It is common for analogic technology to be able to carry out certain functions in many different ways, so it will be apparent for one skilled in the art that the embodiment of FIG. 4 is only an exemplary way of accomplishing the invention disclosed in this patent application. It is not even necessary to divide the components needed for the functions into clearly defined blocks as illustrated in FIG. 2, because in the field of analogical electronics certain functions can often be accomplished by means of a circuit solution with one component and/or circuit performing several simultaneous functions, in which case this kind of component and/or circuit should in FIG. 2 belong to two blocks.

What is claimed is:

1. A power control (20, 40) for controlling the power fed from a voltage source (12) to a load (13), the power control comprising a field effect transistor (21, Q1) for allowing or disabling the flow of electric current from the voltage source to the load as a response to the presence or absence respectively of a control pulse sent to the gate of the field effect transistor, characterized in that the power control comprises means (24, R6, R7) for measuring the change of the field effect transistor gate potential in relation to the voltage over the field effect transistor between the source and the drain and means (25, 26, Q5, Q6, R8, R9, D3, Q3, Q4, D1) for allowing or disabling said control pulse on the basis of the measurement of the gate potential change.

2. A power control according to claim 1, characterized in that said means for measuring the change comprises means (23, R1, R2) for measuring the voltage between the drain and source of said field effect transistor and means (25, R5, Z1, Q5) for comparing the field effect transistor gate potential to a given reference voltage, whereby a means (25, 26, Q5, Q6, R8, R9, D3, Q3, Q4, D1) for allowing or disabling the control pulse are arranged so as to allow the control pulse in a situation where the voltage between the drain and source of the field effect transistor is high and the field effect transistor gate potential is smaller than said reference voltage as well as in a situation where the voltage between the drain and source of the field effect transistor is small, and so as to disable the control pulse in a situation where the voltage between the drain and source of the field effect transistor is high and the field effect transistor gate potential is higher than said reference voltage.

3. A method of protecting a power control from the negative effects of an excessive throughput current, where the power control (20, 40) comprises a field effect transistor (21, Q1) for either allowing or disabling the flow of electric current from a voltage source (12) to a load (13) as a response to the presence or absence of a control pulse sent to the gate of the field effect transistor, characterized in that the method includes measuring (24, R6, R7) the change of the gate potential of said field effect transistor at the start of the control pulse in relation to the voltage over the field effect transistor between the source and the drain and that the power control includes either allowing or disabling (25, 26,

Q5, Q6, R8, R9, D3, Q3, Q4, D1) the control pulse from switching the field effect transistor to conducting state on the basis of the measurement of the gate voltage of the field effect transistor.

4. A method according to claim 3, characterized in that the method includes measuring (23, R1, R2) the voltage between the drain and source of said field effect transistor as well as comparing (25, R5, Z1, Q5) the gate voltage of the field effect transistor to a given reference voltage, whereby the control pulse is allowed to switch the field effect transistor to conducting state when the voltage between the drain and source of the field effect transistor is high and the field effect transistor gate potential is smaller than said reference voltage and when the voltage between the drain and source of the field effect transistor is small; and whereby the control pulse is disabled from switching the field effect transistor to conducting state when the voltage between the drain and source of the field effect transistor is high and the field effect transistor gate potential is higher than the reference voltage.

* * * * *